United States Patent
Tsorng et al.

(10) Patent No.: US 12,232,290 B2
(45) Date of Patent: Feb. 18, 2025

(54) RAIL MOUNTING ASSEMBLY AND KIT FOR MOUNTING CIRCUIT BOARD

(71) Applicant: Quanta Computer Inc., Taoyuan (TW)

(72) Inventors: Yaw-Tzorng Tsorng, Taoyuan (TW); Ming-Lung Wang, Taoyuan (TW); Hong-Yi Huang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 144 days.

(21) Appl. No.: 18/116,975

(22) Filed: Mar. 3, 2023

(65) Prior Publication Data

US 2024/0298420 A1   Sep. 5, 2024

(51) Int. Cl.
*H05K 7/14* (2006.01)
(52) U.S. Cl.
CPC ......... *H05K 7/1492* (2013.01); *H05K 7/1489* (2013.01)
(58) Field of Classification Search
CPC ............................ H05K 7/1492; H05K 7/1489
See application file for complete search history.

(56) References Cited

U.S. PATENT DOCUMENTS

| | | | | |
|---|---|---|---|---|
| 4,109,300 A * | 8/1978 | Reimer | ................ | H05K 7/1425 361/801 |
| 7,277,296 B2 * | 10/2007 | Ice | ........................ | H05K 7/1418 361/756 |
| 7,489,522 B2 * | 2/2009 | Hoshino | .............. | H05K 7/1418 361/756 |
| 2006/0044775 A1 * | 3/2006 | Hoshino | .............. | H05K 7/1418 361/802 |
| 2012/0039047 A1 * | 2/2012 | Nichols | ................ | H05K 7/1418 361/715 |

* cited by examiner

*Primary Examiner* — Anthony M Haughton
*Assistant Examiner* — Hung Q Dang
(74) *Attorney, Agent, or Firm* — NIXON PEABODY LLP

(57) ABSTRACT

A rail mounting assembly for supporting a pair of electrical components on a case of a server is disclosed. The assembly includes a first mounting structure for receiving a first electrical component; a second mounting structure for receiving a second electrical component; and a single rail fixed between the first mounting structure and the second mounting structure, the single rail having an I-shaped cross-section. The single rail includes a first groove configured to engage with the first electrical component when the first electrical component is mounted to the first mounting structure, and a second groove configured to engage with the second electrical component when the second electrical component is mounted to the second mounting structure. A distance between the first electrical component engaged with the first groove and the second electrical component engaged with the second groove is less than 5 mm, preferably equal to or less than 4 mm.

20 Claims, 11 Drawing Sheets

RAIL MOUNTING ASSEMBLY AND KIT FOR MOUNTING CIRCUIT BOARD

FIELD OF THE INVENTION

The present invention relates generally to a rail mounting assembly for supporting a pair of electrical components on a printed circuit board (PCB), and more specifically, to a single rail having an I-shaped cross-section and a pair of grooves configured to engage with the pair of electrical components.

BACKGROUND OF THE INVENTION

Servers are specialized computer systems that include numerous electrical components integrated into a single unit using a server chassis. Common to all servers is some form of a motherboard including a central processing unit (CPU), slots for memory (e.g., DDR3, DDR4, DRAM), PCIe (Peripheral Computer Interconnect Express) slots, and connectors to other components, such as hard drives, a power supply, and peripherals (e.g., USB ports, LAN and other I/O ports).

A number of electrical components or modules, such as Open Compute Project (OCP) card and data center-ready secure control module (DC-SCM), are installed in a server. FIGS. 1A-1C show a prior art rail mounting assembly 100 for receiving an electrical component 300, such as a card/module. Referring to FIG. 1B, conventionally, a prior art rail mounting assembly 100 includes metal sheets 101, 102, each metal sheet including a respective rail 111, 112. Referring to FIG. 1A, each rail 111, 112 has a U-shaped opening or groove 110, 120 to receive an electrical component 300. For example, the prior art rail mounting assembly 100 includes a first rail 111 and a matching second rail 112 that face each other, as shown in FIG. 1B. In general, the prior art rail mounting assembly 100 is fixed on a case of a server by a fastening mechanism such as a rivet. The electrical component 300 is assembled to the pair of rails 111, 112 by being inserted thereto, as shown in FIG. 1C.

FIGS. 2A and 2B show another type of prior art rail mounting assembly 400 having a first rail 401 and a matching second rail 402 that are not attached to metal sheets. FIG. 2A shows a pair of rails 401, 402 that are not fixed on a mainboard/printed circuit board (PCB) in a server, and FIG. 2B shows the pair of rails 401, 402 directly fixed on a PCB 500 fixed on a case of a server. In general, the prior art rails 401, 402 are directly fixed to the PCB 500 by a fastening mechanism 410 such as rivets or screws. The pair of rails 401, 402 fixed on the PCB 500 receives an electrical component 600 such as a card or module, as shown in FIG. 2B.

Referring to FIGS. 3A and 3B, when more than one electrical component 300, for example two electrical components 300-1, 300-2, need to be installed, additional rails 113, 114 are necessary in addition to the rails 111, 112 to receive the two electrical components 300-1, 300-2. One rail 113 is attached to one side of a metal sheet 103 and the other rail 114 is attached to the other side of the metal sheet 103. Thus, an additional space is required on the case of the server for installation of the rails 111, 112, 113, 114 and two electrical components 300-1, 300-2. In view of the limited space available on the case, the space required for installation of the multiple electrical components 300-1, 300-2 needs to be minimized in the case to accommodate other additional components as well.

However, the structure of the prior art rail mounting assembly 100 or 400 is designed such that there is a wide space generated between two electrical components 300-1, 300-2 when they are installed. For example, the structure of the prior art rail mounting assembly 100 further including middle rails 113, 114 is shown in FIG. 3A. The prior art rail mounting assembly 100 includes four separate rails 111, 112, 113, 114 fixed to the case of the server via the metal sheets 101, 102, 103. The middle metal sheet 103 positioned between one metal sheet 101 and another metal sheet 102 is designed to have two rails 113, 114 unlike the metal sheets 101, 102 having only one rail 111, 112, respectively. The rails 113, 114 are attached to the same metal sheet 103 such that the metal sheet 103 is positioned between the rails 113, 114. The rails 113, 114 are positioned between two rails 111, 112. The rail 113 faces the rail 111 and the rail 114 faces the rail 112. Thus, one electrical component 300-1 is installed by being received by the pair of rails 111, 113, and another electrical component 300-2 is installed by being received by the pair of rails 112, 114. See FIG. 3B. A distance between the electrical components 300-1, 300-2 (d1) is affected by the thickness of the middle metal sheet 103 present in between the two rails 113, 114. In general, d1 exemplified in FIG. 3B is about 5 mm or 5 mm.

As another example, the structure of the prior art rail mounting assembly 400 is shown in FIG. 4A. The prior art rail mounting assembly 400 includes four separate rails 401, 402, 403, 404 and they are directly attached to the PCB 500 fixed on the case of the server without metal sheets. The middle rails 403, 404 with their respective openings or grooves 430, 440 facing opposite directions are positioned between two outer rails 401, 402. The rails 403, 404 are in contact with each other or in very close proximity. The rail 403 faces the rail 401 and the rail 404 faces the rail 402. Thus, one electrical component 300-1 is installed by being received by the pair of rails 401, 403, and another electrical component 300-2 is installed by being received by the pair of rails 402, 404. See FIG. 4B. In this case, a distance between the electrical component 300-1, 300-2 (d2) is affected by the gap (g) generated between the two rails 403, 404. In general, d2 exemplified in FIG. 4B is about 15 mm or 15 mm.

The above discussed distances d1, d2 can decrease if middle rails (113/114, 404/404) are designed for efficiency. Therefore, a need exists for a rail mounting assembly having a design/structure to reduce a distance of multiple cards or modules installed therein to less than 5 mm. A need also exists for a simpler structure of a rail mounting assembly allowing easier installation of multiple cards or modules therein, reducing costs associated with multiple parts required for prior art rail mounting assembly.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In view of the above-described problem with the conventional rail mounting assembly, the present application discloses a rail mounting assembly having a single rail having an I-shaped cross-section to reduce the space required for mounting a pair of electrical components on a PCB.

According to certain aspects of the present disclosure, a rail mounting assembly for supporting a pair of electrical components on a case of a server is disclosed. According to various embodiments, the rail mounting assembly includes a first mounting structure for receiving a first electrical component of the pair of electrical components and a second mounting structure for receiving a second electrical component of the pair of electrical components. The first mounting structure is configured to allow electrical coupling between the first electrical component and a printed circuit board (PCB) mounted to the server, and the second mounting structure is configured to allow electrical coupling between the second electrical component and the PCB. The rail mounting assembly further includes a single rail fixed between the first mounting structure and the second mounting structure. The single rail has an I-shaped cross-section and includes an elongated body having a top member, a bottom member, and a middle member connecting the top member and the bottom member. A first groove is formed at a first side of the middle member between the top member and the bottom member, and the first groove is configured to engage with the first electrical component when the first electrical component is mounted to the first mounting structure. Further, a second groove is formed at a second side of the middle member between the top member and the bottom member, the second side being an opposite side of the first side. The second groove is configured to engage with the second electrical component when the second electrical component is mounted to the second mounting structure.

According to another aspect of the assembly, a width of the middle member or a distance between the first side and the second side of the middle member is equal to or less than 4 mm. In some embodiments, a width of the top member and a width of the bottom member are same. In some embodiments, the width of the top member or the bottom member is greater than the width of the middle member. In some embodiments, a length of the top member and a length of the bottom member are same. In some embodiments, a distance between the first electrical component engaged with the first groove and the second electrical component engaged with the second groove is equal to or less than 4 mm.

For example, the pair of electrical components includes a plug-in card/module, a network card/module, or Open Compute Project (OCP) 3.0/Datacenter-ready Secure Control Module (DC-SCM)/mezzanine card/module.

According to another aspect of the assembly, at least one receiving portion configured to receive at least one fastener is formed at the bottom member. In some embodiments, a number of the at least one receiving portion is 1, 2, or 3. In some embodiments, the at least one receiving portion is threaded, and the at least one fastener inserted into the at least one receiving portion has corresponding threads. For example, the at least one fastener includes a bolt or screw. In some embodiments, the at least one fastener passes through the case of the server to be fastened into the at least one receiving portion.

According to another aspect of the assembly, the single rail is made of a plastic material such as polyamide (PA), polycarbonate (PC), Acrylonitrile Butadiene Styrene (ABS), acetal (POM), and/or polypropylene (PP). According to other aspects of the present disclosure, an assembly kit is enclosed. According to various embodiments, the assembly kit includes a printed circuit board (PCB); a pair of electrical components comprising a first electrical component and a second electrical component; and a rail mounting assembly for supporting the pair of electrical components on a case of a server. In various embodiments, the rail mounting assembly includes a first mounting structure fixed to the case, the first mounting structure being configured to allow electrical coupling between the first electrical component and the PCB. The rail mounting assembly further includes a second mounting structure fixed to the case, the second mounting structure being configured to allow electrical coupling between the second electrical component and the PCB. The rail mounting assembly further includes a single rail fixed to the case between the first mounting structure and the second mounting structure. The single rail has an I-shaped cross-section and includes an elongated body having a top member, a bottom member, and a middle member connecting the top member and the bottom member. A first groove is formed at a first side of the middle member between the top member and the bottom member. The first groove is configured to engage with the first electrical component when the first electrical component is mounted to the first mounting structure. A second groove is formed at a second side of the middle member between the top member and the bottom member, the second side being an opposite side of the first side. The second groove is configured to engage with the second electrical component when the second electrical component is mounted to the second mounting structure.

According to another aspect of the assembly kit described above, at least one through hole is formed at one side of the case, and at least one receiving portion is formed at the bottom member of the single rail. The at least one receiving portion is configured to receive at least one fastener for fixing the single rail to the case.

According to another aspect of the assembly kit described above, the at least one fastener passes through the at least one through hole of the case and is screwed into the at least one receiving portion of the single rail. In some embodiments, a number of the at least one receiving portion is 1, 2, or 3. In some embodiments, the at least one receiving portion is threaded, and the at least one fastener inserted into the at least one receiving portion has corresponding threads. For example, the at least one fastener is a bolt or screw.

For example, the pair of electrical components includes a plug-in card/module, a network card/module, or Open Compute Project (OCP) 3.0/Datacenter-ready Secure Control Module (DC-SCM)/mezzanine card/module.

According to another aspect of the server described above, a width of the middle member or a distance between the first side and the second side of the middle member is equal to or less than 4 mm. According to another aspect of the server described above, a distance between the first electrical component engaged with the first groove and the second electrical component engaged with the second groove is equal to or less than 4 mm.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1A:
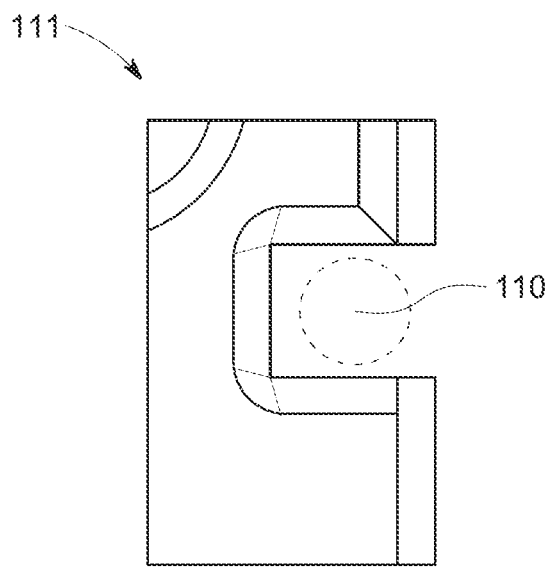
FIG. 1A is a front view of a rail of a prior art rail mounting assembly for supporting an electrical component on a PCB.
Figure 1B:
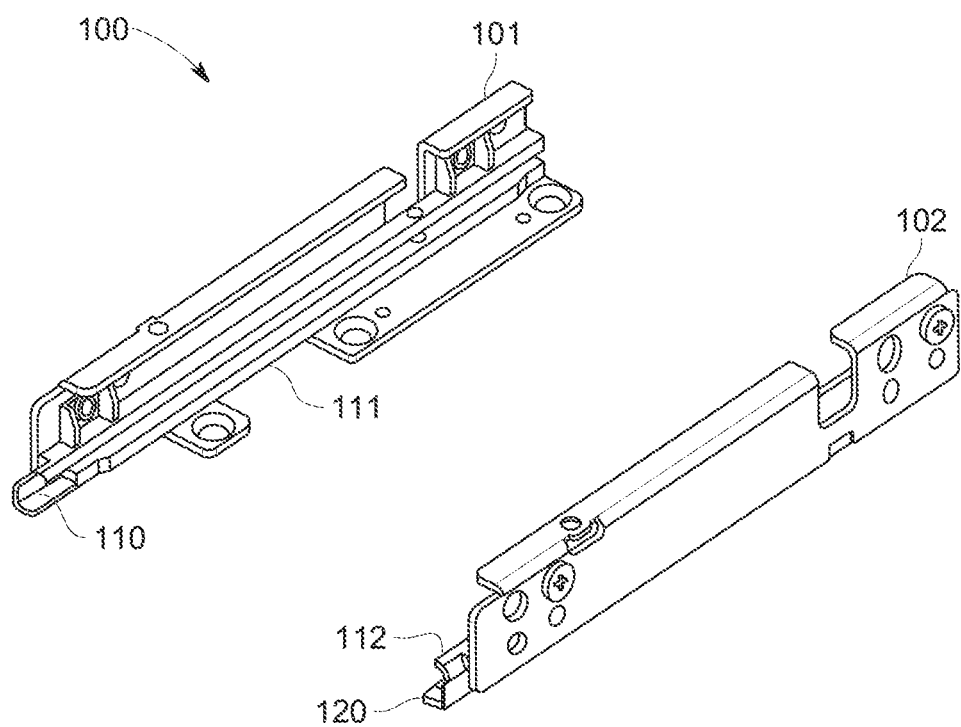
FIG. 1B is a perspective view of a prior art rail mounting assembly.
Figure 1C:
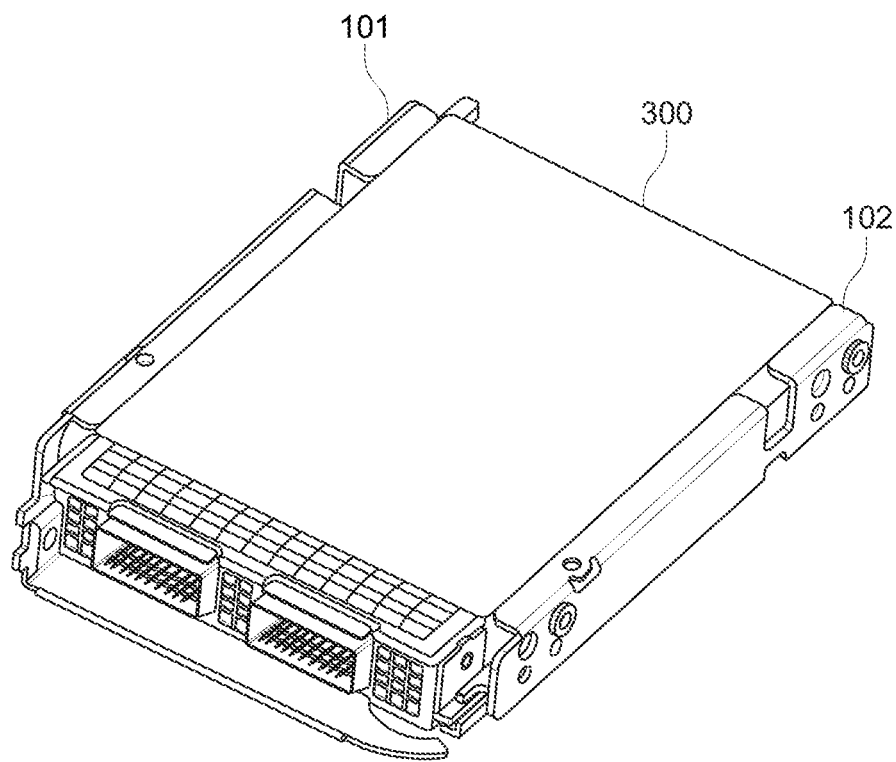
FIG. 1C is a perspective view of the prior art rail mounting assembly shown in FIG. 1B, the rail mounting assembly fixed to a PCB and an electronic component assembled therein.
Figure 2A:
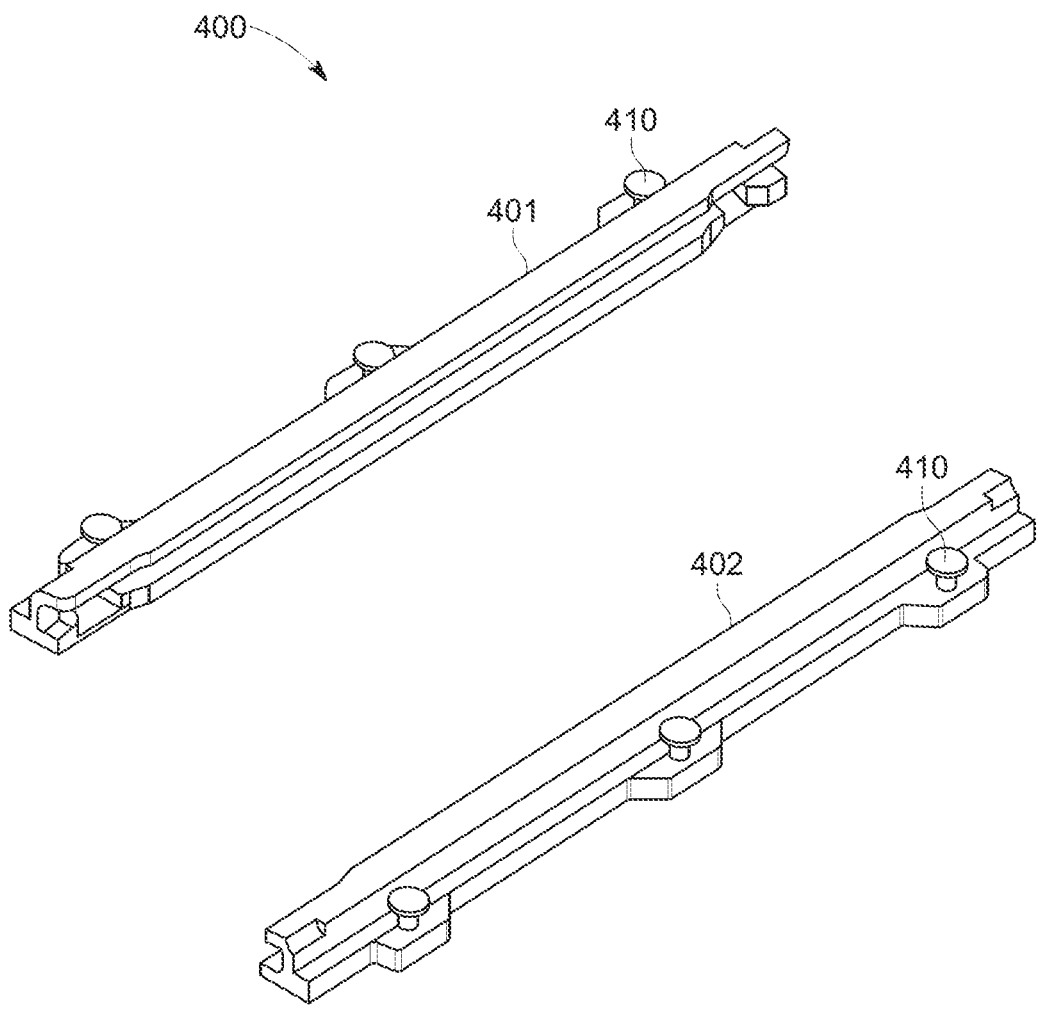
FIG. 2A is a perspective view of a prior art rail mounting assembly.
Figure 2B:
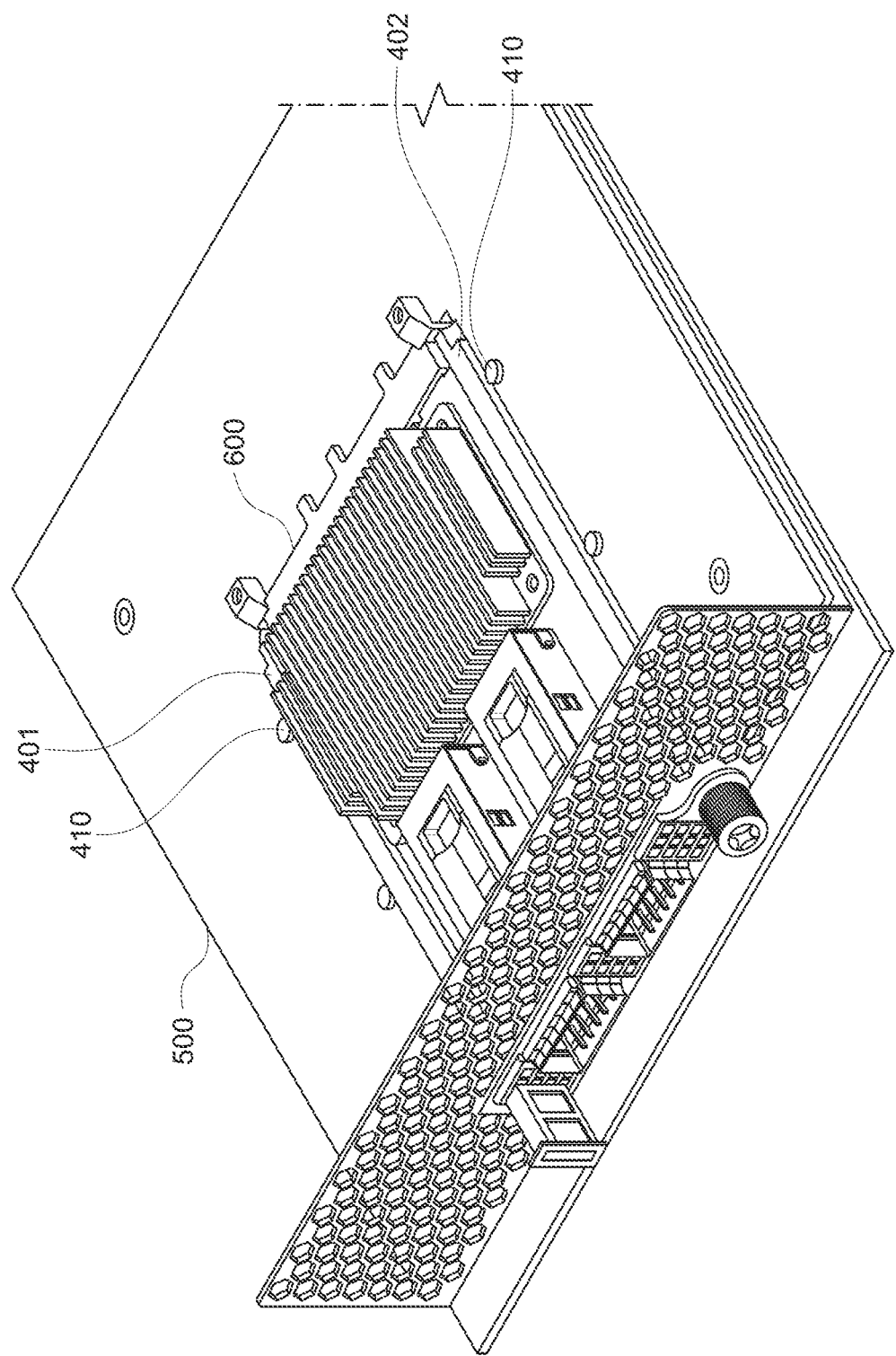
FIG. 2B is a perspective view of the prior art rail mounting assembly shown in FIG. 2A, the rail mounting assembly fixed to a PCB and an electronic component assembled therein.

Elements in the figures are illustrated for simplicity and clarity and have not necessarily been drawn to scale. For example, the dimensions and/or relative positioning of some of the elements in the figures may be exaggerated relative to other elements to help improve understanding of various features.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 5A:
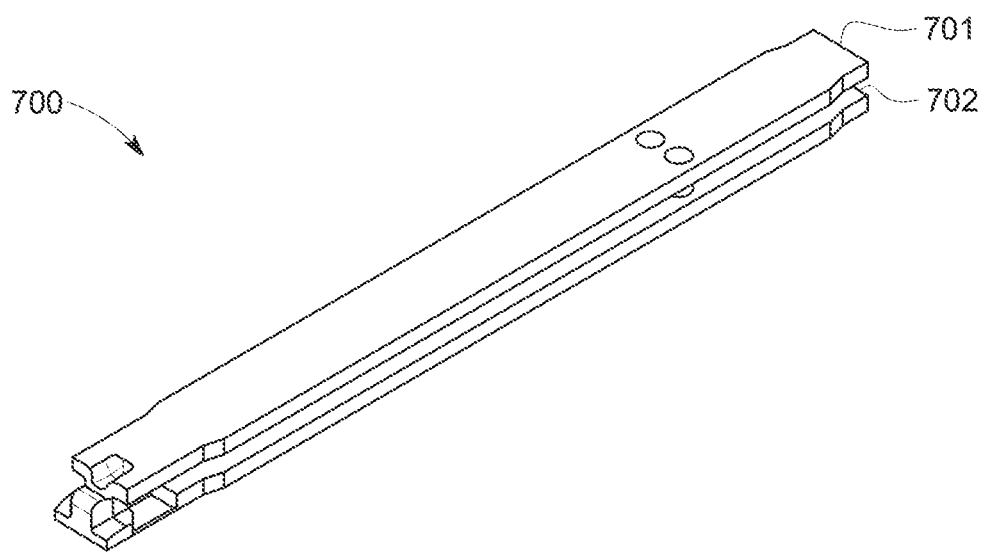
FIG. 5A is a perspective view of a single rail, according to certain aspects of the present disclosure.
Figure 5B:
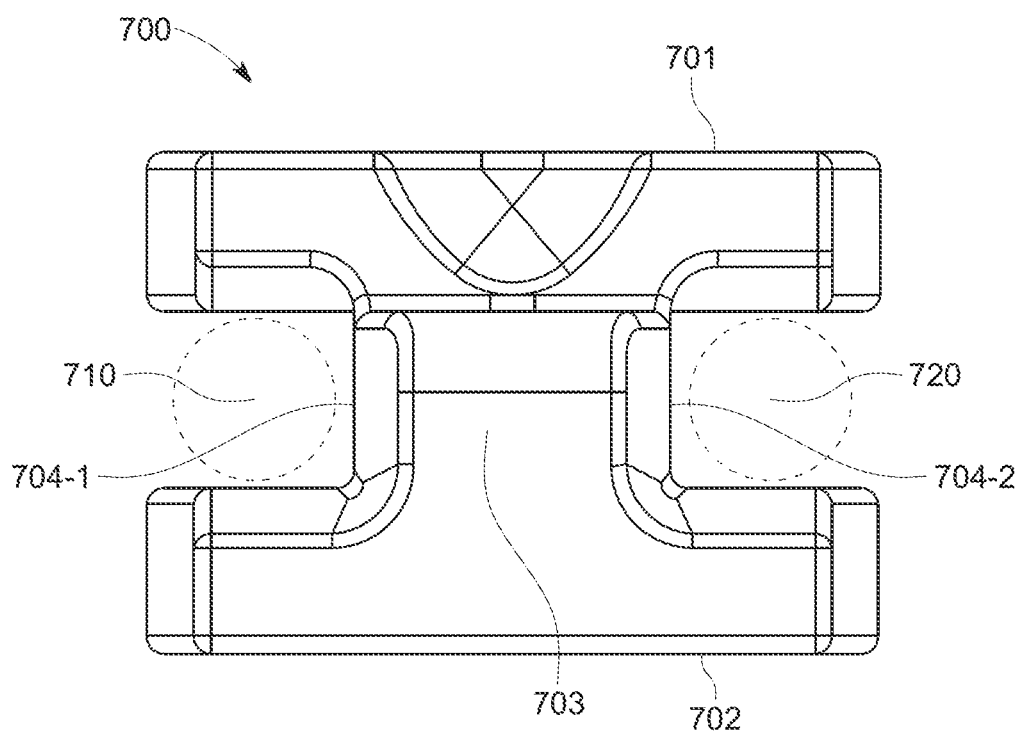
FIG. 5B is a front view of the single rail shown in FIG. 5A, according to certain aspects of the present disclosure.
Figure 6:
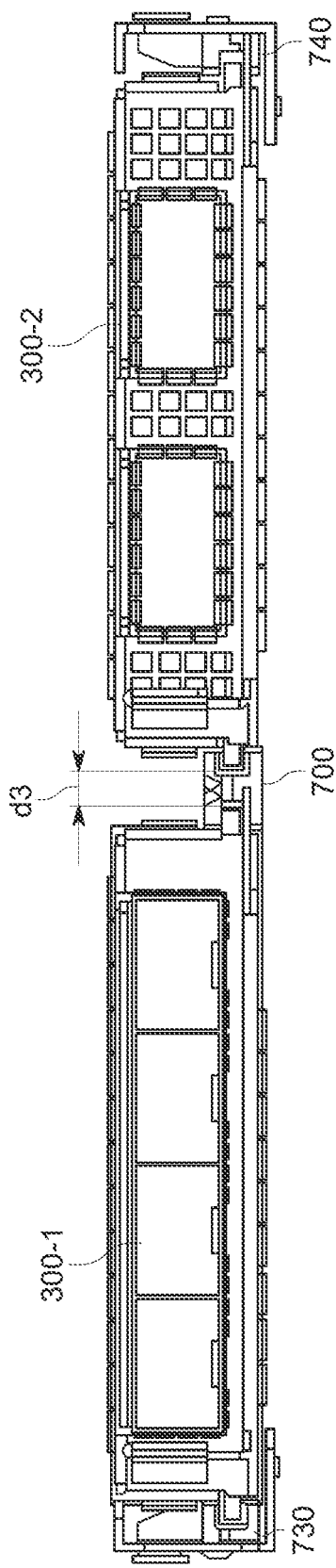
FIG. 6 is a front view of a rail mounting assembly including the single rail shown in FIGS. 5A and 5B with a pair of electrical components assembled therein, according to certain aspects of the present disclosure.

A single rail 700 according to various embodiments of the present invention is shown in FIGS. 5A and 5B. The single rail 700 has an I-shaped cross-section as shown in FIG. 5B. The single rail 700 includes an elongated body having a top member 701, a bottom member 702, and a middle member 703 connecting the top member 701 and the bottom member 702. A first groove 710 is formed at a first side 704-1 of the middle member 703 between the top member 701 and the bottom member 702. As shown in FIG. 6, the first groove 710 is configured to engage with a first electrical component 300-1. Further, a second groove 720 is formed at a second side 704-2 of the middle member 703 between the top member 701 and the bottom member 702, the second side being an opposite side of the first side. The second groove 720 is configured to engage with a second electrical component 300-2.

Figure 7A:
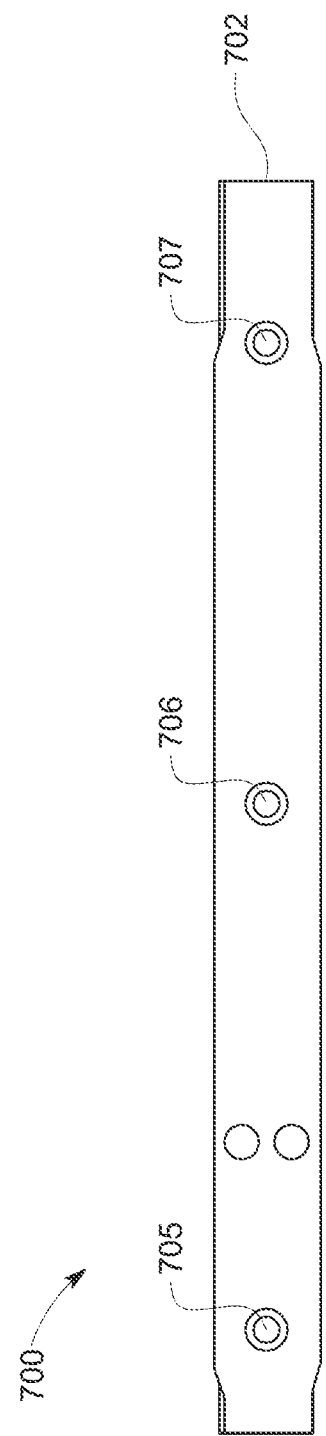
FIG. 7A is a bottom view of the single rail shown in FIGS. 5A and 5B, according to certain aspects of the present disclosure.
Figure 7B:
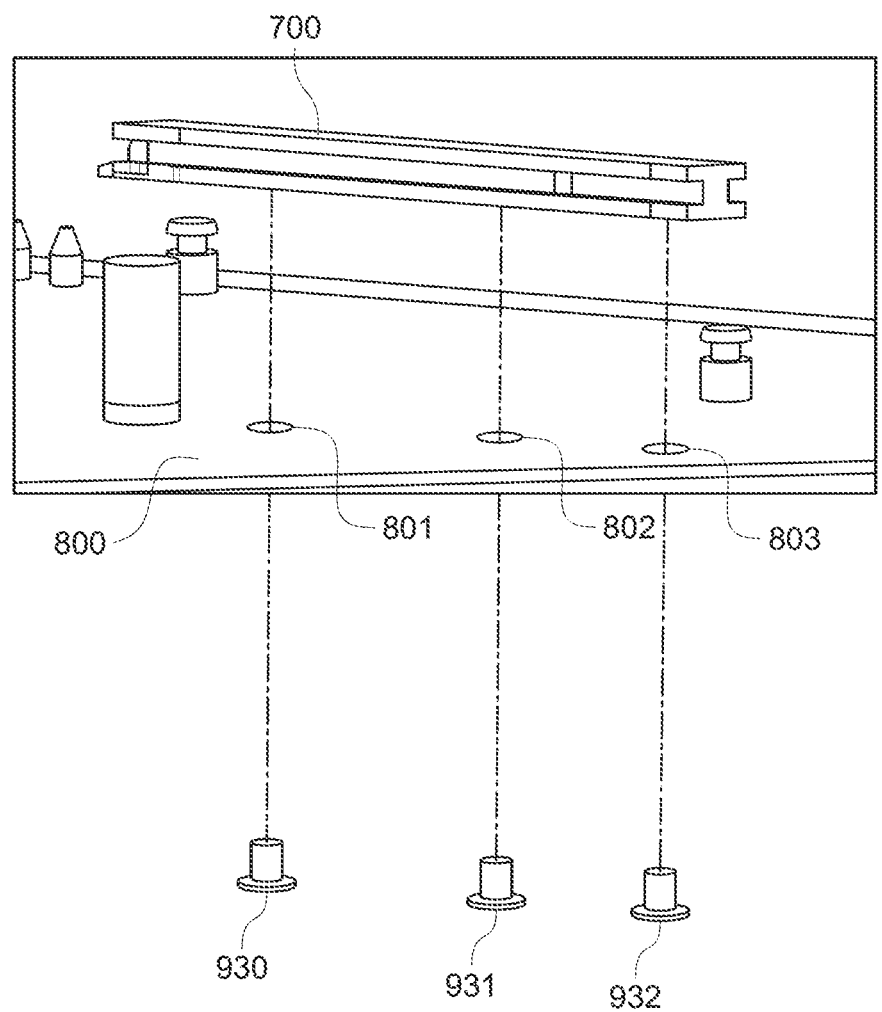
FIG. 7B shows how a single rail is fixed to a case of a PCB, according to certain aspects of the present disclosure.

According to various embodiments of the present invention, a rail mounting assembly for supporting a pair of electrical components is fixed on a case 800 of a server, as shown in FIG. 7B. The rail mounting assembly according to various embodiments of the present invention includes a first mounting structure 730 for receiving a first electrical component 300-1 of the pair of electrical components and a second mounting structure 740 for receiving a second electrical component 300-2 of the pair of electrical components. See FIG. 6. The first mounting structure 730 is configured to allow electrical coupling between the first electrical component 300-1 and a PCB fixed on the case 800. The second mounting structure 740 is configured to allow electrical coupling between the second electrical component 300-2 and the PCB. The inventive single rail 700 is included in the rail mounting assembly to support the pair of electrical components 300-1, 300-2 on the case 800 of the server.

Referring to FIGS. 6 and 7B, the single rail 700 is fixed on the case 800 between the first mounting structure 730 and the second mounting structure 740. As shown in FIG. 5B, the single rail 700 has an I-shaped cross-section. The first groove 710 is configured to engage with the first electrical component 300-1 when the first electrical component is mounted to the first mounting structure 730. Further, the second groove 720 is configured to engage with the second electrical component 300-2 when the second electrical component is mounted to the second mounting structure 740.

Referring to FIGS. 5A and 5B, a width of the middle member 703 or a distance between the first side 704-1 and the second side 704-2 of the middle member 703 is equal to or less than 4 mm or about 4 mm. In some embodiments, the distance between the first side 704-1 and the second side 704-2 of the middle member 703 is between about 4 mm and about 3.5 mm. In some embodiments, the distance between the first side 704-1 and the second side 704-2 of the middle member 703 is about 3.5 mm, about 3 mm, or between about 3.5 mm and about 3 mm. In some embodiments, the distance between the first side 704-1 and the second side 704-2 of the middle member 703 is less than about 3 mm. In some embodiments, a width of the top member 701 and a width of the bottom member 702 are same. In some embodiments, the width of the top member 701 or the bottom member 702 is greater than the width of the middle member 703. In some embodiments, a length of the top member 701 and a length of the bottom member 702 are same.

Figure 3A:
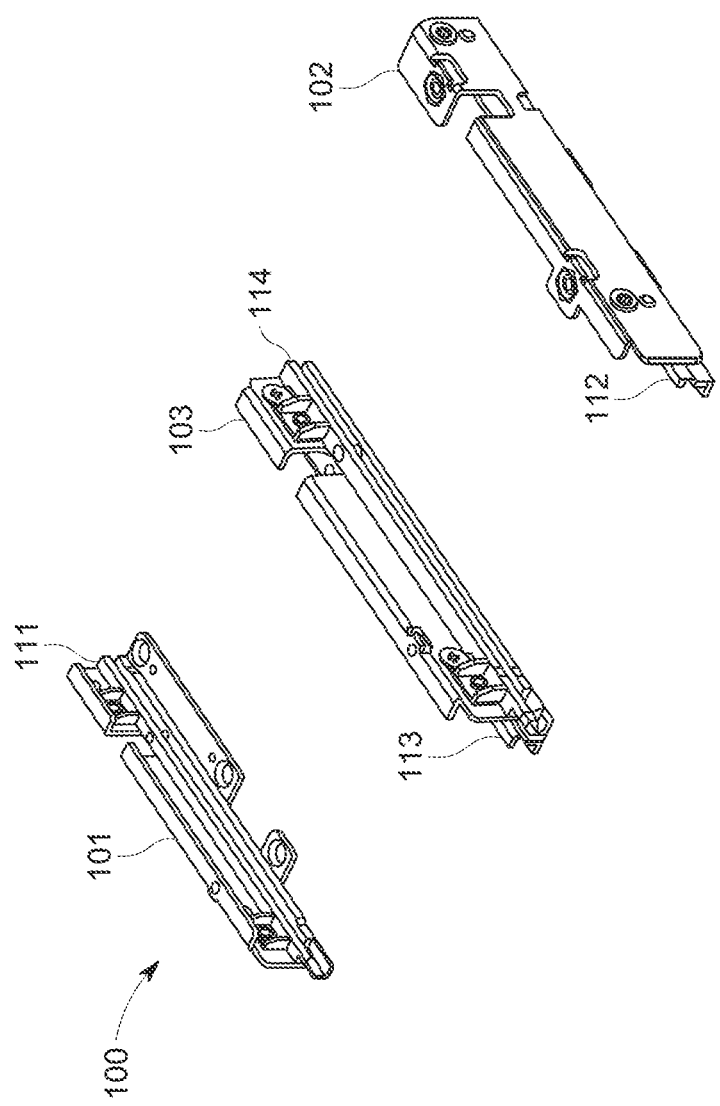
FIG. 3A is a perspective view of a prior art rail mounting assembly for supporting a pair of electrical components.
Figure 3B:
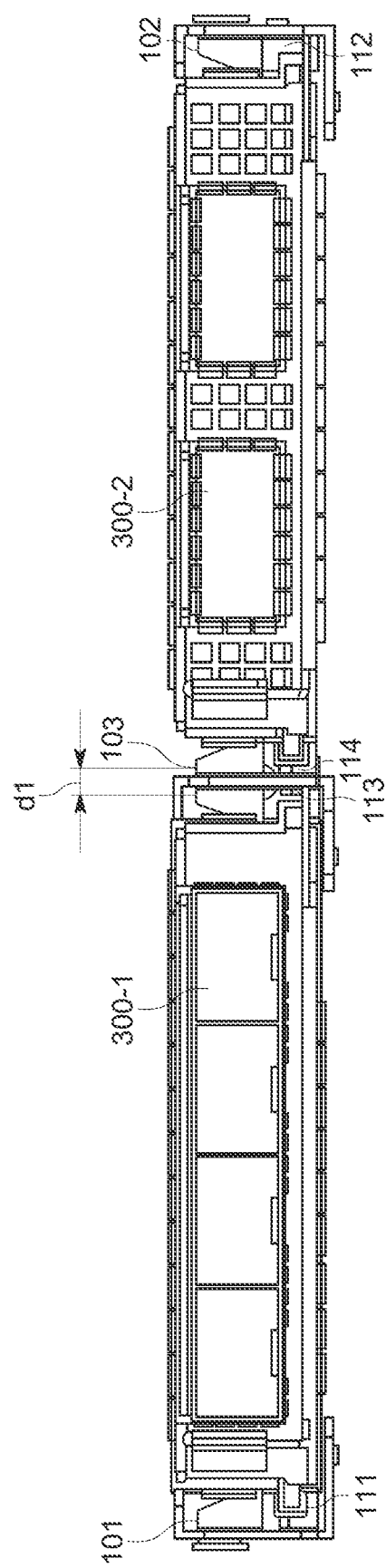
FIG. 3B is a front view of the prior art rail mounting assembly shown in FIG. 3A, a pair of electronic components assembled therein.
Figure 4A:
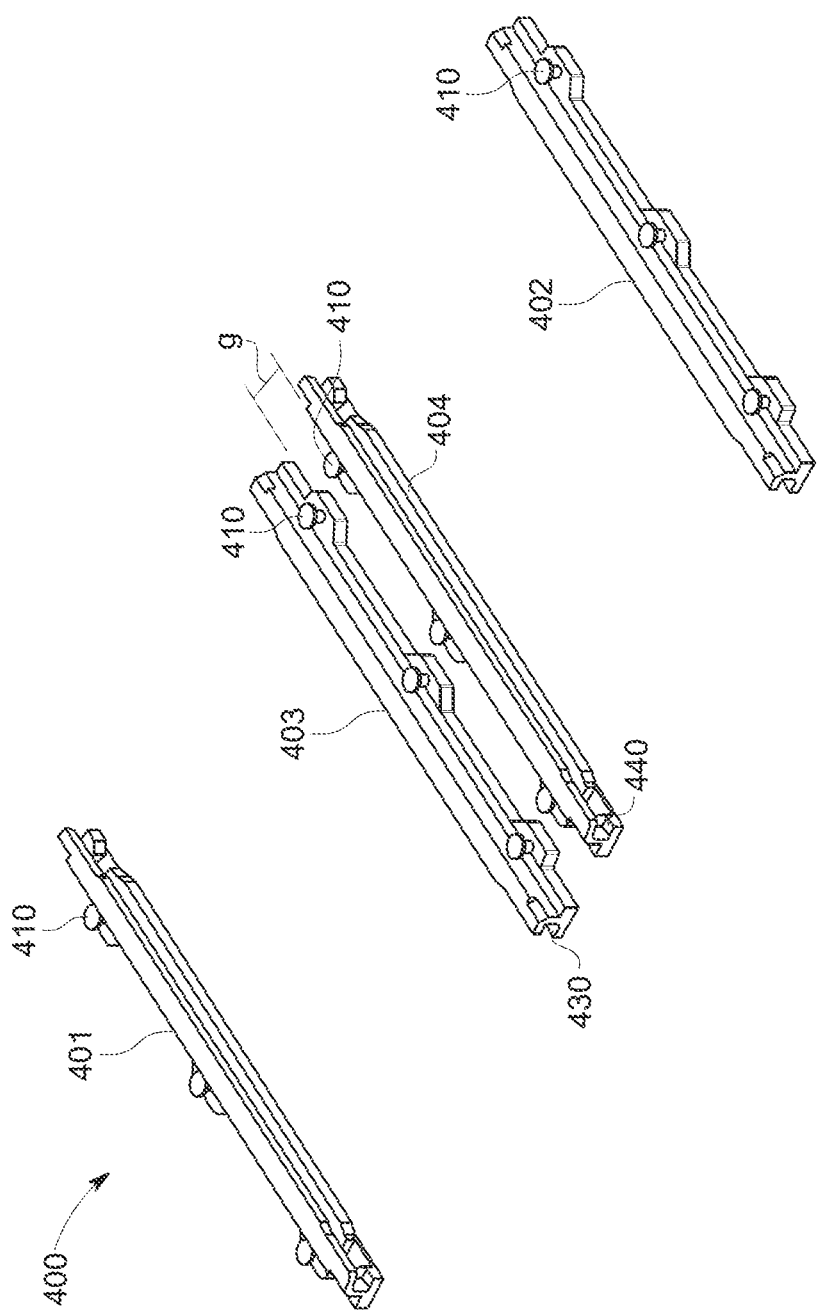
FIG. 4A is a perspective view of a prior art rail mounting assembly for supporting a pair of electrical components.
Figure 4B:
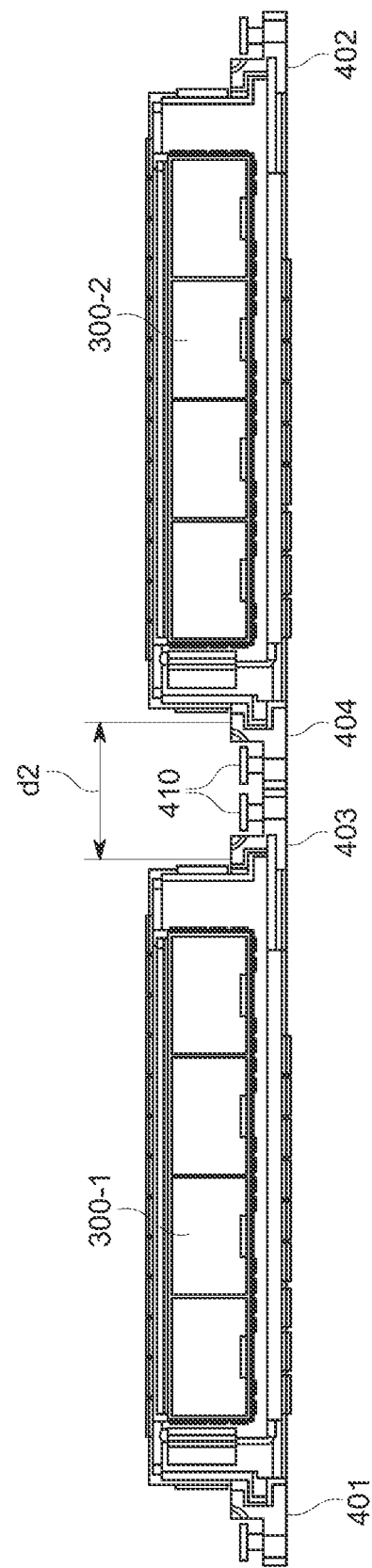
FIG. 4B is a front view of the prior art rail mounting assembly shown in FIG. 4A, a pair of electronic components assembled therein.

As exemplified in FIG. 6, a distance (d3) between the first electrical component 300-1 engaged with the first groove 710 and the second electrical component 300-2 engaged with the second groove 720 is equal to or less than 4 mm. In some embodiments, the distance (d3) between the first electrical component 300-1 engaged with the first groove 710 and the second electrical component 300-2 engaged with the second groove 720 is between about 4 mm and about 3.5 mm. In some embodiments, the distance (d3) between the first electrical component 300-1 engaged with the first groove 710 and the second electrical component 300-2 engaged with the second groove 720 is about 3.5 mm, about 3 mm, or between about 3.5 mm and 3 mm. In some embodiments, the distance (d3) between the first electrical component 300-1 engaged with the first groove 710 and the second electrical component 300-2 engaged with the second groove 720 is less than about 3 mm. Thus, d3 shown in FIG. 6 is less than d1 and d2 shown in FIGS. 3B and 4B.

In various embodiments, the pair of electrical components 300-1, 300-2 includes a plug-in card/module, a network card/module, or Open Compute Project (OCP) 3.0/Datacenter-ready Secure Control Module (DC-SCM)/mezzanine card/module.

Referring to FIGS. 7A and 7B, in some embodiments, at least one receiving portion 705, 706, 707 configured to receive at least one fastener 930, 931, 932 is formed at the bottom member 702 of the single rail 700. For example, a number of the at least one receiving portion 705/706/707 is 1, 2, or 3. In some embodiments, the at least one receiving portion 705, 706, 707 is threaded, and the at least one fastener 930, 931, 932 inserted into the at least one receiving portion 705, 706, 707 has corresponding threads. For example, the at least one fastener 930, 931, 932 includes a bolt or screw.

Referring to FIG. 7B, the at least one fastener 930, 931, 932 passes through the case 800 of the server to be fastened into the at least one receiving portion 705, 706, 707. In some embodiments, the single rail 700 is made of a plastic material such as polyamide (PA), polycarbonate (PC), Acrylonitrile Butadiene Styrene (ABS), acetal (POM), and/or polypropylene (PP). However, the materials used for the single rail are not limited thereto and the single rail may be made of any other suitable materials.

Referring to FIG. 6, according to certain aspects of the present disclosure, an assembly kit includes a PCB, a pair of electrical components including a first electrical component 300-1 and a second electrical component 300-2, and a rail mounting assembly for supporting the pair of electrical components 300-1, 300-2 on the case 800 of the server. According to various embodiments of the present invention, the rail mounting assembly includes a first mounting structure 730 fixed to the case 800, the first mounting structure 730 being configured to allow electrical coupling between the first electrical component 300-1 and the PCB mounted in the server. The rail mounting assembly of the assembly kit further includes a second mounting structure 740 fixed to the case 800, the second mounting structure 740 being configured to allow electrical coupling between the second electrical component 300-2 and the PCB. The rail mounting assembly of the assembly kit further includes a single rail 700 fixed to the case 800 between the first mounting structure 730 and the second mounting structure 740.

Referring to FIGS. 5A and 5B, the single rail 700 has an I-shaped cross-section that includes an elongated body having a top member 701, a bottom member 702, and a middle member 703 connecting the top member 701 and the bottom member 702. At the single rail 700, a first groove 710 is formed at a first side 704-1 of the middle member 703 between the top member 701 and the bottom member 702. The first groove 710 is configured to engage with the first electrical component 300-1 when the first electrical component is mounted to the first mounting structure 730. At the single rail 700, a second groove 720 is formed at a second side 704-2 of the middle member 703 between the top member 701 and the bottom member 702, the second side being an opposite side of the first side. The second groove 720 is configured to engage with the second electrical component 300-2 when the second electrical component is mounted to the second mounting structure 740.

Referring to FIG. 7B, at least one through hole 801, 802, 803 is formed at one side of the case 800 of the server. Further, referring to FIGS. 7A and 7B, at least one receiving portion 705, 706, 707 is formed at the bottom member 702 of the single rail 700. The at least one receiving portion 705, 706, 707 is configured to receive at least one fastener 930, 931, 932 for fixing the single rail 700 to the case 800. The at least one fastener 930, 931, 932 passes through the at least one through hole 801, 802, 803 of the case 800 and is screwed into the at least one receiving portion 705, 706, 707 of the single rail 700. For example, a number of the at least one receiving portion 705, 706, 707 is 1, 2, or 3. However, the number of the at least one receiving portion 705, 706, 707 is not limited thereto and may be greater than 3.

In some embodiments, the at least one receiving portion 705, 706, 707 is threaded, and the at least one fastener 930, 931, 932 inserted into the at least one receiving portion 705, 706, 707 has corresponding threads. For example, the at least one fastener 930, 931, 932 includes a bolt or screw.

For example, the pair of electrical components 300-1, 300-2 includes a plug-in card/module, a network card/module, or Open Compute Project (OCP) 3.0/Datacenter-ready Secure Control Module (DC-SCM)/mezzanine card/module.

In some embodiments, a width of the middle member 703 or a distance between the first side 704-1 and the second side 704-2 of the middle member 703 is less than 5 mm. In some embodiments, a distance between the first electrical component 300-1 engaged with the first groove 710 and the second electrical component 300-2 engaged with the second groove 720 is less than 5 mm.

In some embodiments, a width of the middle member 703 or a distance between the first side 704-1 and the second side 704-2 of the middle member 703 is equal to or less than 4 mm. In some embodiments, a distance between the first electrical component 300-1 engaged with the first groove 710 and the second electrical component 300-2 engaged with the second groove 720 is equal to or less than 4 mm.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A rail mounting assembly for supporting a pair of electrical components on a case of a server, the rail mounting assembly comprising:
    a first mounting structure for receiving a first side of a first electrical component of the pair of electrical components, the first mounting structure being configured to allow electrical coupling between the first electrical component and a printed circuit board (PCB) mounted to the server;
    a second mounting structure for receiving a first side of a second electrical component of the pair of electrical components, the second mounting structure being configured to allow electrical coupling between the second electrical component and the PCB; and
    a single rail fixed between the first mounting structure and the second mounting structure, the single rail being parallel to the first mounting structure and the second mounting structure, the single rail having an I-shaped cross-section that includes
        an elongated body having a top member, a bottom member, and a middle member connecting the top member and the bottom member,
        a first groove formed at a first side of the middle member between the top member and the bottom member, the first groove being configured to receive a second side of the first electrical component when the first side of the first electrical component is received by the first mounting structure, wherein the first side and the second side of the first electrical component are parallel, the second side of the first electrical component being an opposite side of the first side of the first electrical component, and
        a second groove formed at a second side of the middle member between the top member and the bottom member, the second side of the middle member being an opposite side of the first side of the middle member, the second groove being configured to receive a second side of the second electrical component when the first side of the second electrical component is received by the second mounting structure, wherein the first side and the second side of the second electrical component are parallel, the second side of the second electrical component being an opposite side of the first side of the second electrical component.

2. The rail mounting assembly of claim 1, wherein a width of the middle member or a distance between the first side and the second side of the middle member is equal to or less than 4 millimeters (mm).

3. The rail mounting assembly of claim 1, wherein:
    a width of the top member and a width of the bottom member are same; and
    the width of the top member or the bottom member is greater than a width of the middle member.

4. The rail mounting assembly of claim 3, wherein a length of the top member and a length of the bottom member are same.

5. The rail mounting assembly of claim 1, wherein a distance between the first electrical component engaged with the first groove and the second electrical component engaged with the second groove is equal to or less than 4 millimeters (mm).

6. The rail mounting assembly of claim 1, wherein the pair of electrical components comprises a plug-in card/module, a network card/module, or Open Compute Project (OCP) 3.0/Datacenter-ready Secure Control Module (DC-SCM)/mezzanine card/module.

7. The rail mounting assembly of claim 1, wherein at least one receiving portion configured to receive at least one fastener is formed at the bottom member.

8. The rail mounting assembly of claim 7, wherein a number of the at least one receiving portion is 1, 2, or 3.

9. The rail mounting assembly of claim 7, wherein the at least one receiving portion is threaded, and the at least one fastener inserted into the at least one receiving portion has corresponding threads.

10. The rail mounting assembly of claim 9, wherein the at least one fastener comprises a bolt or screw.

11. The rail mounting assembly of claim 7, wherein the at least one fastener passes through the case to be fastened into the at least one receiving portion.

12. The rail mounting assembly of claim 1, wherein the single rail is made of a plastic material including polyamide (PA), polycarbonate (PC), Acrylonitrile Butadiene Styrene (ABS), acetal (POM), and/or polypropylene (PP).

13. An assembly kit comprising:
a printed circuit board (PCB);
a pair of electrical components comprising a first electrical component and a second electrical component; and
a rail mounting assembly for supporting the pair of electrical components on a case of a server,
wherein the rail mounting assembly comprises:
a first mounting structure fixed to the case, the first mounting structure being configured to allow electrical coupling between the first electrical component and the PCB;
a second mounting structure fixed to the case, the second mounting structure being configured to allow electrical coupling between the second electrical component and the PCB; and
a single rail fixed to the case between the first mounting structure and the second mounting structure, the single rail being parallel to the first mounting structure and the second mounting structure, the single rail having an I-shaped cross-section that includes
an elongated body having a top member, a bottom member, and a middle member connecting the top member and the bottom member,
a first groove formed at a first side of the middle member between the top member and the bottom member, the first groove being configured to receive a second side of the first electrical component when a first side of the first electrical component is received by the first mounting structure, wherein the first side and the second side of the first electrical component are parallel, the second side of the first electrical component being an opposite side of the first side of the first electrical component, and
a second groove formed at a second side of the middle member between the top member and the bottom member, the second side of the middle member being an opposite side of the first side of the middle member, the second groove being configured to receive a second side of the second electrical component when a first side of the second electrical component is received by the second mounting structure, wherein the first side and the second side of the second electrical component are parallel, the second side of the second electrical component being an opposite side of the first side of the second electrical component.

14. The assembly kit of claim 13, wherein:
at least one through hole is formed at one side of the case;
at least one receiving portion is formed at the bottom member of the single rail; and
the at least one receiving portion is configured to receive at least one fastener for fixing the single rail to the case.

15. The assembly kit of claim 14, wherein the at least one fastener passes through the at least one through hole of the case and is screwed into the at least one receiving portion of the single rail.

16. The assembly kit of claim 14, wherein a number of the at least one receiving portion is 1, 2, or 3.

17. The assembly kit of claim 14, wherein the at least one receiving portion is threaded, and the at least one fastener inserted into the at least one receiving portion has corresponding threads.

18. The assembly kit of claim 17, wherein the at least one fastener comprises a bolt or screw.

19. The assembly kit of claim 13, wherein the pair of electrical components comprises a plug-in card/module, a network card/module, or Open Compute Project (OCP) 3.0/Datacenter-ready Secure Control Module (DC-SCM)/mezzanine card/module.

20. The assembly kit of claim 13, wherein:
a width of the middle member or a distance between the first side and the second side of the middle member is equal to or less than 4 millimeters (mm); and/or
a distance between the first electrical component engaged with the first groove and the second electrical component engaged with the second groove is equal to or less than 4 mm.

* * * * *